United States Patent
Chou et al.

(10) Patent No.: US 7,226,871 B2
(45) Date of Patent: Jun. 5, 2007

(54) METHOD FOR FORMING A SILICON OXYNITRIDE LAYER

(75) Inventors: Lin-En Chou, Hsinchu (TW); Hung-Che Ting, Hsinchu (TW)

(73) Assignee: Industrial Technology Research Institute, Hsinchu (TW)

( * ) Notice: Subject to any disclaimer, the term of this patent is extended or adjusted under 35 U.S.C. 154(b) by 0 days.

(21) Appl. No.: 11/252,560

(22) Filed: Oct. 19, 2005

(65) Prior Publication Data

US 2006/0148140 A1      Jul. 6, 2006

(30) Foreign Application Priority Data

Dec. 31, 2004   (TW) .............................. 93141624 A

(51) Int. Cl.
*H01L 21/302*   (2006.01)
*H01L 21/461*   (2006.01)

(52) U.S. Cl. ...................... 438/723; 438/743; 438/756; 438/680; 257/21; 257/17; 257/278; 257/293

(58) Field of Classification Search ................ 438/723, 438/743, 756, 30, 142, 663, 676, 678, 679, 438/753, 757, 724, 744, 680, 770, 775
See application file for complete search history.

(56) References Cited

U.S. PATENT DOCUMENTS

| | | | | |
|---|---|---|---|---|
| 5,674,783 A | * | 10/1997 | Jang et al. | 438/697 |
| 6,407,007 B1 | * | 6/2002 | Tsan et al. | 438/763 |
| 6,569,777 B1 | * | 5/2003 | Hsu et al. | 438/725 |
| 6,878,639 B1 | * | 4/2005 | Tsai et al. | 438/740 |

OTHER PUBLICATIONS

Lin-En Chou, et al., "An Improvement Process for Gate Oxide of LTPS TFT by Using N2O Plasma Nitridation." 2004 SID.

* cited by examiner

*Primary Examiner*—David Nhu
(74) *Attorney, Agent, or Firm*—Harness, Dickey & Pierce, P.L.C.

(57) ABSTRACT

A method for forming a silicon oxynitride layer, suitable to be used in the production of semiconductor devices, e.g. poly-silicon thin film transistors, is provided. A plasma surface treatment is performed over a substrate after a silicon nitride/silicon oxide layer has been formed on the substrate by a glow discharge system to transform the silicon nitride/silicon oxide layer into a silicon oxynitride layer. The semiconductor device may be completely manufactured in simplex equipment. Therefore, the production time and production cost are favorably reduced.

18 Claims, 2 Drawing Sheets

METHOD FOR FORMING A SILICON OXYNITRIDE LAYER

PRIORITY STATEMENT

This Non-provisional application claims priority under 35 U.S.C. §119(a) on Patent Application No(s). 93141624 filed in Taiwan on Dec. 31, 2004, the entire contents of which are hereby incorporated by reference.

BACKGROUND

1. Field of Invention

The invention relates to a method for forming a silicon oxynitride layer and, in particular, to a method for forming a silicon oxynitride layer, suitable to be used in a fabrication process of semiconductor devices, e.g. poly-silicon (poly-Si) thin film transistors (TFTs).

2. Related Art

Due to its high carrier mobility, low temperature sensitivity, and better driving power, the poly-Si TFT is more suitable for high-speed devices. The liquid crystal display (LCD) that uses the poly-Si as its switching device has a faster and brighter display image. Moreover, the peripheral driving devices and control circuits can be made on the same substrate. The device reliability can be significantly enhanced while the production cost is favorably lowered. Therefore, the poly-Si TFT LCD has become the mainstream development.

In the structure of a conventional poly-Si TFT, a silicon oxide layer is used as the gate insulator. Due to the defects in silicon oxide itself and the defects in the surface bond structure between the silicon oxide and poly-Si, a large leak current may be produced in the poly-Si TFT to result in worse devices. Therefore, it is often necessary to perform annealing at high temperatures. This requires the use of quartz as the substrate. Nevertheless, the cost of quartz substrates is too high. To reduce the cost, one may use glass instead. In that case, the annealing time is longer and its effect is very limited.

Silicon oxynitride has the advantages of both silicon oxide and silicon nitride. It further has a higher thermal stability, low stress, and can effectively reduce the thermal electron effect and the diffusion of alkaline ions (e.g. Na and K ions) in the glass substrate. Therefore, one may first transform the silicon oxide into a nitride as the insulator in the poly-Si TFT. However, the high temperatures required in normal nitridation processes are often above the melting point of the glass substrate. It is then unable to reduce the production cost. Consequently, the rapid thermal annealing (RTA) is developed. In order to utilize this method, additional large equipment is required. Not only does it increase the equipment cost, it is also very hard to integrate the new equipment into the existing low-temperature poly-Si TFT process. At present, the poly-Si TFT has not only a silicon oxide layer but also a silicon oxynitride layer directly formed as the insulator. Relating to the silicon nitride layer, it is almost unused to be as the insulator of the poly-Si TFT. As a result, since a dielectric constant thereof is higher than that of the silicon oxide layer, when the silicon nitride layer is proved as the insulator, a threshold voltage of the device may float and an electron mobility of the device may be lower. Therefore, under the consideration of cost, how to use existing fabrication devices to make better poly-Si TFT's is an important topic in the field of poly-Si LCD.

SUMMARY

In view of the foregoing, the invention is directed to a method for forming a silicon oxynitride layer, suitable to be used in the fabrication process of semiconductor devices, e.g. poly-Si TFTs, to solve one or more problems disclosed in the prior art. To achieve the above objects, a method for forming making a silicon oxynitride layer, having the features of the invention, is provided. The method comprises following steps. First, a glow discharge system with a cavity is provided. Then, a substrate is placed in the cavity. A silicon nitride layer is formed on the surface of the substrate using the plasma enhanced chemical vapor deposition (PECVD) technique. The cavity is filled with an oxygenic gas. Following, the oxygenic gas is excited into oxygenic plasma, and then the silicon nitride layer is treated with the oxygenic plasma to form a silicon oxynitride layer.

In the case, the silicon oxynitride layer may be formed in the top, the bottom (i.e. the border between the substrate and the silicon nitride layer) or the inner of the silicon nitride layer. Furthermore, the silicon nitride layer is completely or substantially converted into the silicon oxynitride layer. Preferably, the silicon oxynitride layer is formed in the bottom of the silicon nitride layer.

Moreover, other thin film processes (e.g. the gate, source, and drain) of the semiconductor devices, e.g. the poly-Si TFT, can be accomplished within a glow discharge system. Therefore, the fabrication time and production cost are favorably reduced. Moreover, that the silicon oxynitride layer is formed through the plasma surface treatment does not need to heat the substrate or change the substrate nature.

Further, the substrate is also deposited with a silicon oxide layer first. Then, a nitrogen gas is provided and excited into plasma to perform a nitrogen plasma treatment, thereby turning the silicon oxide layer into a silicon oxynitride layer.

In this case, the silicon oxynitride layer may be formed in the top, the bottom (i.e. the border between the substrate and the silicon oxide layer) or the inner of the silicon oxide layer. Furthermore, the silicon oxide layer is completely or substantially transformed into the silicon oxynitride layer. Preferably, the silicon oxynitride layer is formed in the bottom of the silicon oxide layer.

Moreover, other thin film processes (e.g. the gate, source, and drain) of the semiconductor devices, e.g. the poly-Si TFT, can be accomplished within a glow discharge system. Therefore, the fabrication time and production cost are favorably reduced. Furthermore, using the plasma surface treatment to turn the silicon oxide layer into the silicon oxynitride layer does not need to heat the substrate or change the substrate nature.

Moreover, the method, having the features of the invention, can be used to make the buffer layer or gate insulator layer of the semiconductor device, e.g. the TFT.

In summary, a plasma surface treatment is performed over a substrate after a silicon nitride layer or a silicon oxide layer has been formed on the substrate by a glow discharge system to transform the silicon nitride layer or the silicon oxide layer into a silicon oxynitride layer. The semiconductor device, e.g. the poly-silicon thin film transistor, may completely manufacture in simplex equipment. Therefore, the production time and production cost are favorably reduced.

That is, the invention can integrate the semiconductor devices fabrication process, e.g. the poly-Si TFT fabrication process, with the thin film deposition process using the glow discharge system without the need to take out the substrate for other nitridation processes.

BRIEF DESCRIPTION OF THE DRAWINGS

The invention will become more fully understood from the detailed description given herein below illustration only, and thus are not limitative of the present invention, and wherein.

DETAILED DESCRIPTION

A method for forming a silicon oxynitride layer according to the invention differs from the conventions. In general, when a silicon oxide layer is had, the silicon oxide layer is directly formed on a substrate during the process of the convention. Alternatively, when a silicon oxynitride layer is had, the silicon oxynitride layer is directly formed during the process of the convention. But, the process, in which the silicon oxynitride layer is directly formed, is difficult and complex. The method, having the features of the invention, may be to form the silicon oxynitride layer not only using a silicon oxide layer, which is generally used in the process of fabricating a semiconductor devices, e.g. poly-Si TFT, or a silicon nitride layer, which is almost unused in the process of fabricating the semiconductor devices, but also utilizing single process equipment, e.g. glow discharge system.

The method of forming a silicon oxynitride layer according to the invention is suitable to be used to form a buffer layer or a gate insulator layer in the process of fabricating semiconductor devices, e.g. poly-Si TFT.

Figure 1:
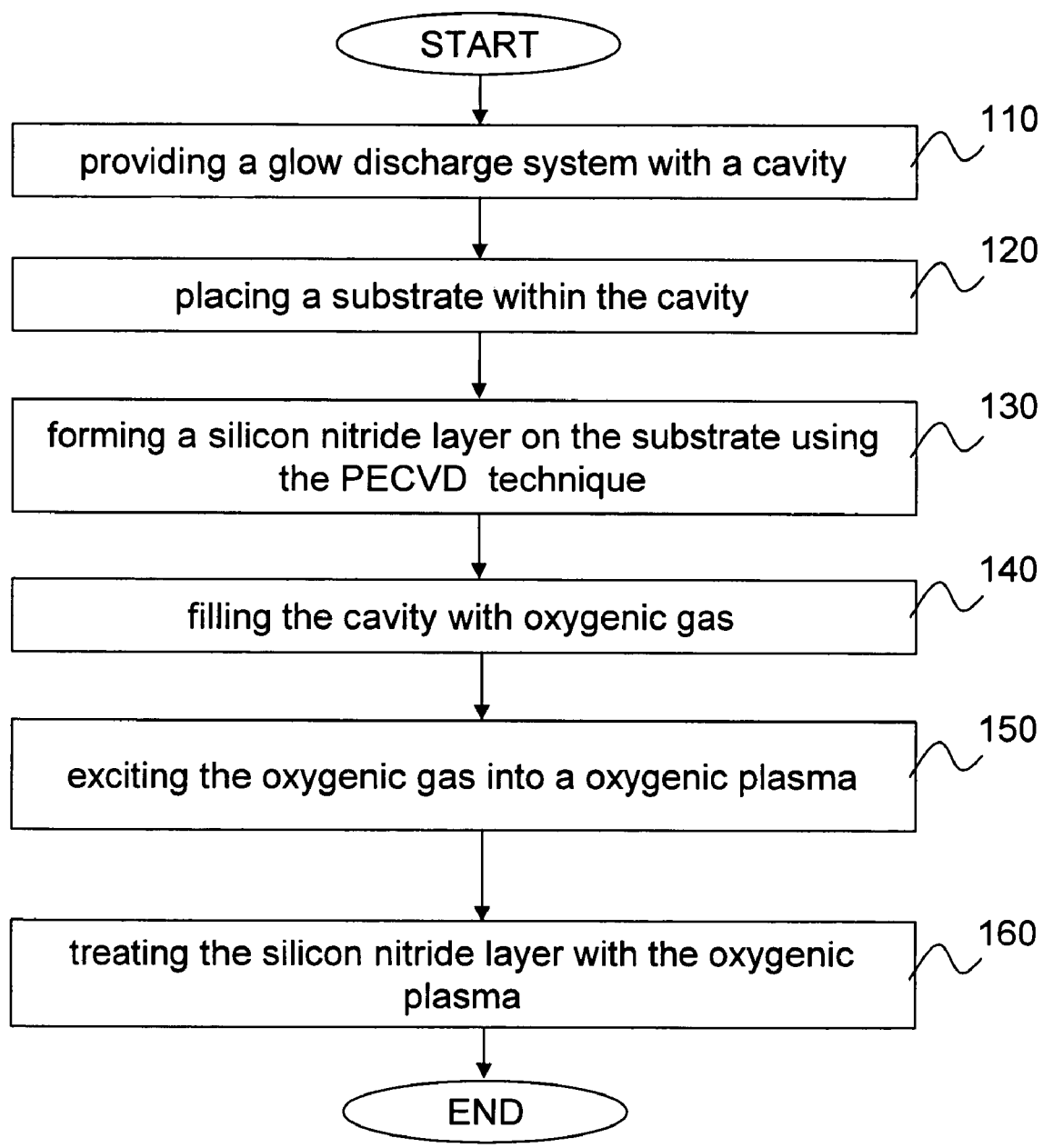
FIG. 1 illustrates a flowchart of a method for forming a silicon oxynitride layer according to an embodiment of the invention.

Refer to FIG. 1, which shows a flowchart of a method for forming a silicon oxynitride layer according to an embodiment of the invention. First, a glow discharge system with a cavity is provided (step 110 of FIG. 1). The glow discharge system may be a plasma enhanced chemical vapor deposition (PECVD) system, e.g. a radio-frequency (RF) PECVD system, an electron cyclotron resonance chemical vapor deposition (ECR-CVD) system, a remote plasma chemical vapor deposition (CVD) system, or a magnetic plasma chemical vapor deposition (CVD) system, etc. And, the cavity may be a vacuum cavity. Further, the glow discharge system has a plasma excitation source. Then, a substrate is placed within the cavity (step 120 of FIG. 1). A silicon nitride layer is formed on the surface of the substrate using the PECVD technique (step 130 of FIG. 1). Following, the cavity is filled with an oxygenic gas (step 140 of FIG. 1). The oxygenic gas is excited into oxygenic plasma by the plasma excitation source (step 150 of FIG. 1), and then the silicon nitride layer is treated with the oxygenic plasma to form a silicon oxynitride layer (step 160 of FIG. 1). Afterwards, other thin film processes (e.g. forming the gate, source, and drain of the transistor) for the semiconductor device can be completed in the same cavity. In the case, the silicon oxynitride layer may be formed in the top, the bottom (i.e. the border between the substrate and the silicon nitride layer) or the inner of the silicon nitride layer. Furthermore, the silicon nitride layer is completely or substantially converted into the silicon oxynitride layer. Preferably, the silicon oxynitride layer is formed in the bottom of the silicon nitride layer. Herein, the device with the silicon oxynitride layer, into which the silicon nitride layer is transformed, has better electron mobility.

Therefore, the fabrication steps are continuous and convenient for mass production. The time for loading in, taking out, and pre-processing the substrate is saved to avoid unnecessary contamination.

The substrate can be made of glass. The oxygenic gas is rich in ions, e.g. oxygen ions, nitrogen oxide ions, or mixture thereof, etc. Therefore, the oxygenic gas for producing the plasma can be $O_2$ or $N_2O$.

For example, a glass substrate is placed in the cavity of the PECVD system. After a poly silicon (poly-Si) layer and one or more sources/drains are made on the glass substrate, a silicon nitride layer is deposited on the glass substrate. Herein, the silicon nitride layer can act as a gate insulator layer. Then, the cavity is filled with the oxygenic gas, e.g. $O_2$ or $N_2O$, and the oxygenic gas is excited into oxygenic plasma by the plasma excitation source. In other words, an oxygen-containing species are formed by the dissociation of the oxygenic gas during the oxygenic plasma process, and the incorporate into the silicon nitride layer to cause electron traps, thereby forming the silicon oxynitride layer below 400. Herein, the input power of the plasma excitation source is determined by the filling gas, oxidization extent, and the process. In accord with the current embodiment, during this plasma process, the pressure in the cavity is tuned to 1200 mTorr to 1800 mTorr, the plasma treatment time is between 30 seconds (secs) and 90 secs, and the input power of the plasma excitation source is 1500 watt (W) to 1800 W. Relatively, the prior art requires a long time and high temperature to accomplish the fabrication of the same device. Therefore, the fabrication time and production cost are greatly reduced employing the method according to the invention.

Figure 2:
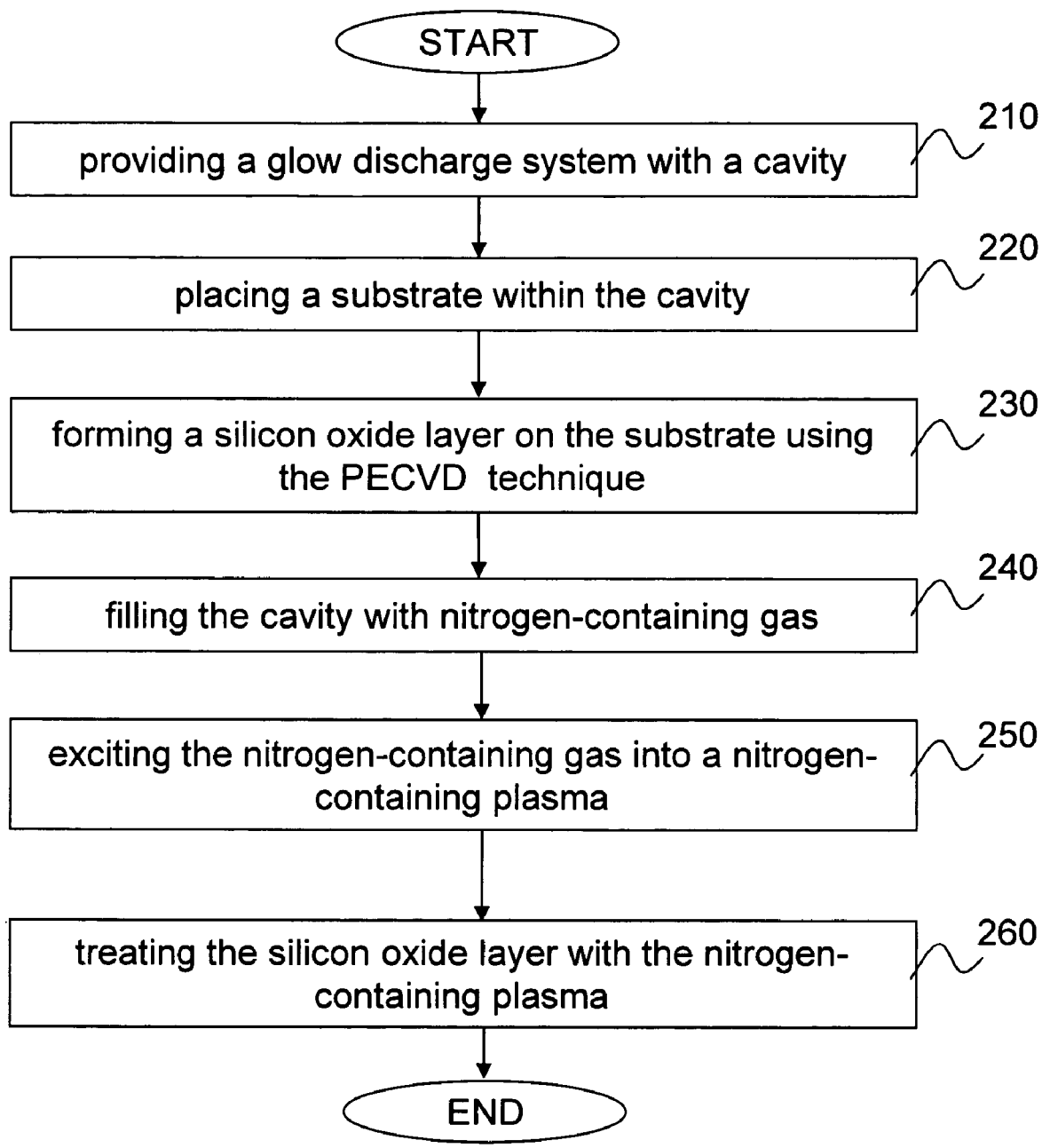
FIG. 2 illustrates a flowchart of a method for forming a silicon oxynitride layer according to another embodiment of the invention.

Besides, the silicon oxynitride layer is also formed using the silicon oxide layer based on the invention. A flowchart, showed the steps according to another embodiment of the invention, is illustrated in FIG. 2. First, in step 210, a glow discharge system with a cavity is provided. The glow discharge system may be a PECVD system that includes the cavity and a plasma excitation source. In step 220, a substrate is placed within the cavity. In step 230, a silicon oxide layer is formed on the surface of the substrate using the PECVD technique. In step 240, the cavity is filled with a nitrogen-containing gas. In step 250, the nitrogen-containing gas is excited into nitrogen-containing plasma by the plasma excitation source. In step 260, perform the nitrogen-containing plasma treatment on the silicon oxide layer, turning silicon oxide into silicon oxynitride. Afterwards, other thin film processes (e.g. forming the gate, source, and drain of the transistor) for the poly-Si TFT can be completed in the same cavity. This makes the fabrication steps continuous and convenient for mass production. The time for loading in, taking out, and pre-processing the substrate is saved to avoid unnecessary contamination.

In this case, the silicon oxynitride layer may be formed in the top, the bottom (i.e. the border between the substrate and the silicon oxide layer) or the inner of the silicon oxide layer. Furthermore, the silicon oxide layer is completely or substantially converted into the silicon oxynitride layer. Preferably, the silicon oxynitride layer is formed in the bottom of the silicon oxide layer. Herein, the device with the silicon oxynitride layer, into which the silicon oxide layer is transformed, has the capability of better driving control.

The substrate can be made of glass. The nitrogen-containing gas is rich in ions, e.g. nitrogen ion, nitrogen oxide ion, nitrogen hydride ion, or mixture thereof, etc. Therefore, the nitrogen-containing gas for producing the plasma can be $N_2$, $N_2O$ or $NH_3$. In the step of filling the cavity with the nitrogen-containing gas, the pressure in the cavity is tuned to 1200 mTorr to 1800 mTorr. The input power of the plasma excitation source is determined by the filling gas, nitration extent, and the process. In accord with the current embodiment, the plasma treatment time is between 30 and 90 seconds. The prior art requires a long time and higher temperature to accomplish the same steps. Therefore, the invention greatly reduces the fabrication time and production cost.

The PECVD system used in the invention can be a radio-frequency (RF) PECVD system, an electron cyclotron resonance chemical vapor deposition (ECR-CVD) system, a remote plasma CVD system or a magnetic plasma CVD system.

Certain variations would be apparent to those skilled in the art, which variations are considered within the spirit and scope of the claimed invention.

What is claimed is:

1. A method for forming a silicon oxynitride layer, the method comprising:
   providing a substrate;
   forming a silicon nitride layer on the substrate;
   providing an oxygenic gas;
   exciting the oxygenic gas into an oxygenic plasma; and
   treating the silicon nitride layer with the oxygenic plasma to form a silicon oxynitride layer, wherein all the steps of the method are completed in a single cavity and the substrate stays in the single cavity during all the steps of the method, thin film processes for forming a gate, a source, and a drain of a transistor for a semiconductor device is subsequently completed in the single cavity, and the substrate stays in the single cavity during all the thin film processes.

2. The method of claim 1, wherein the oxygenic gas is rich in a plurality of ions, which are at least one of oxygen ion and nitrogen oxide ion.

3. The method of claim 1, wherein the oxygenic gas is one of $O_2$ and $N_2$.

4. The method of claim 1, wherein the substrate is a glass substrate.

5. The method of claim 1, wherein the silicon oxynitride layer is used as a gate insulator layer.

6. The method of claim 1, wherein the silicon oxynitride layer is used as the buffer layer.

7. The method of claim 1, wherein the silicon oxynitride layer is formed by a glow discharge system.

8. The method of claim 7, wherein the glow discharge system is a plasma enhanced chemical vapor deposition (PECVD) system.

9. The method of claim 8, wherein the PECVD system is one of a radio-frequency (RF) PECVD system, an electron cyclotron resonance chemical vapor deposition (ECR-CVD) system, a remote plasma chemical vapor deposition (CVD) system, and a magnetic plasma chemical vapor deposition (CVD) system.

10. A method for forming a silicon oxynitride layer, the method comprising:
    providing a substrate;
    forming a silicon oxide layer on the substrate;
    providing a nitrogen-containing gas;
    exciting the nitrogen-containing gas into a nitrogen-containing plasma; and
    treating the silicon oxide layer with the nitrogen-containing plasma to form a silicon oxynitride layer, wherein all the steps of the method are completed in a single cavity and the substrate stays in the single cavity during all the steps of the method, thin film processes for forming a gate, a source, and a drain of a transistor for a semiconductor device is subsequently completed in the single cavity, and the substrate stays in the single cavity during all the thin film processes.

11. The method of claim 10, wherein the nitrogen-containing gas has a plurality of ions, which are at least one of nitrogen ion, nitrogen oxide ion, and nitrogen hydride ion.

12. The method of claim 11, wherein the nitrogen-containing gas is selected from the group consisting of $N_2$, $N_2O$ and $NH_3$.

13. The method of claim 10, wherein the substrate is a glass substrate.

14. The method of claim 10, wherein the silicon oxynitride layer is used as a gate insulator layer.

15. The method of claim 10, wherein the silicon oxynitride layer is used as the buffer layer.

16. The method of claim 10, wherein the silicon oxynitride layer is a glow discharge system.

17. The method of claim 16, wherein the glow discharge system is a PECVD system.

18. The method of claim 17, wherein the PECVD system is one of a radio-frequency (RF) PECVD system, an electron cyclotron resonance chemical vapor deposition (ECR-CVD) system, a remote plasma chemical vapor deposition (CVD) system, and a magnetic plasma chemical vapor deposition (CVD) system.

* * * * *